United States Patent
Peijster et al.

(10) Patent No.: US 8,905,369 B2
(45) Date of Patent: Dec. 9, 2014

(54) VIBRATION ISOLATION MODULE AND SUBSTRATE PROCESSING SYSTEM

(75) Inventors: Jerry Johannes Martinus Peijster, Maartensdijk (NL); Rogier Martin Lambert Ellenbroek, Delfgauw (NL); Guido De Boer, Leerdam (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 14/241,109

(22) PCT Filed: Sep. 10, 2012

(86) PCT No.: PCT/EP2012/067608
§ 371 (c)(1),
(2), (4) Date: Feb. 26, 2014

(87) PCT Pub. No.: WO2013/034753
PCT Pub. Date: Mar. 14, 2013

(65) Prior Publication Data
US 2014/0197330 A1    Jul. 17, 2014

Related U.S. Application Data

(60) Provisional application No. 61/532,615, filed on Sep. 9, 2011.

(51) Int. Cl.
*H01J 37/20* (2006.01)
*F16F 15/04* (2006.01)
(Continued)

(52) U.S. Cl.
CPC .............. *H01J 37/20* (2013.01); *H01J 37/3177* (2013.01); *H01J 37/02* (2013.01); *G03F 7/70833* (2013.01);
(Continued)

(58) Field of Classification Search
CPC ........ G03F 7/709; G03F 7/70833; F16F 15/02; F16F 15/085; H01J 2237/0216; H01J 37/02; H01J 37/20; H01L 21/67353; H01L 21/67369; H01L 21/68
USPC ............ 250/396 R, 453.11, 442.11; 248/610, 248/550, 638, 424; 700/280; 355/75
See application file for complete search history.

(56) References Cited

U.S. PATENT DOCUMENTS 7,025,005 B2 *  4/2006  Shinozaki et al. ............... 108/20
7,275,627 B1 * 10/2007  Mayama ......................... 188/378
(Continued)

FOREIGN PATENT DOCUMENTS

DE      3934805 C1     12/1990
DE      19844707 A1     6/1999
(Continued)

OTHER PUBLICATIONS

Chikkamaranahalli et al, "Damping mechanisms for precision applications in UHV environment.", Precision Systems Lab., George Washington Univ., Nat. Inst. of Standards & Tech, Mar. 1, 2004.

(Continued)

*Primary Examiner* — Nikita Wells
(74) *Attorney, Agent, or Firm* — Hoyng Monegier LLP; David P. Owen (57) ABSTRACT

The invention relates to a vibration isolation module (101) for a lithographic apparatus or an inspection apparatus. The module comprises a support frame (102), an intermediate body (103) and a support body (104) for accommodating the lithographic apparatus. The intermediate body is connected to the support frame by means of at least one spring element such that the intermediate body is a hanging body. The support body is connected to the intermediate body by means of at least one pendulum rod (108) such that the support body is a hanging body. The invention further relates to a substrate processing system comprising such vibration isolation module.

19 Claims, 7 Drawing Sheets

(51) Int. Cl.
  *F16F 15/10* (2006.01)
  *H01J 37/317* (2006.01)
  *H01J 37/02* (2006.01)
  *G03F 7/20* (2006.01)
  *F16F 15/08* (2006.01)

(52) U.S. Cl.
  CPC ....... *F16F 15/085* (2013.01); *H01J 2237/0216* (2013.01); *G03F 7/709* (2013.01); *F16F 15/04* (2013.01)
  USPC .......... 248/638; 248/610; 248/550; 248/424; 250/453.11; 250/442.11; 250/396 R; 355/75; 700/280

(56) References Cited

U.S. PATENT DOCUMENTS

| | | | |
|---|---|---|---|
| 7,607,543 B2 * | 10/2009 | Gregerson et al. | 206/710 |
| 7,991,566 B2 | 8/2011 | Maas et al. | |
| 2002/0118346 A1 | 8/2002 | Galburt et al. | |
| 2003/0057346 A1 * | 3/2003 | Wakui | 248/550 |
| 2004/0160585 A1 | 8/2004 | Jacobs et al. | |
| 2007/0139635 A1 | 6/2007 | Binnard et al. | |
| 2009/0086178 A1 | 4/2009 | Shibazaki | |
| 2009/0246703 A1 | 10/2009 | Starreveld et al. | |
| 2011/0042579 A1 | 2/2011 | De Boer et al. | |
| 2011/0043781 A1 | 2/2011 | Ebihara et al. | |
| 2011/0147612 A1 | 6/2011 | Peijster et al. | |

FOREIGN PATENT DOCUMENTS

| | | |
|---|---|---|
| EP | 0100785 A1 | 2/1984 |
| EP | 1143492 A1 | 10/2001 |
| JP | 2000 018301 A | 1/2000 |
| JP | 2001102286 A2 | 4/2001 |
| JP | 2003 130132 A | 5/2003 |
| JP | 2005030486 A2 | 2/2005 |
| WO | WO 2006038952 A2 | 4/2006 |

OTHER PUBLICATIONS

"Viton", Wikipedia.org. Dec. 1, 2009.

* cited by examiner

VIBRATION ISOLATION MODULE AND SUBSTRATE PROCESSING SYSTEM

BACKGROUND OF THE INVENTION

1. Field of the Invention

The invention relates to a substrate processing system comprising a vibration isolation module for a lithographic apparatus or inspection apparatus. The invention further relates to a vibration isolation module for a lithographic apparatus or an inspection apparatus.

2. Description of the Related Art

In the semiconductor industry, an ever increasing desire exists to manufacture smaller structures with high accuracy and reliability. In lithography systems this desire results in extremely high demands with respect to positioning and orientation. External vibrations caused by other machines in a fab environment and/or electrical circuitry may have a negative influence on the positioning accuracy within the lithographic apparatus. Similarly, vibrations within a lithographic apparatus, for example caused by stage movement, may have a negative influence on such accuracy.

BRIEF SUMMARY OF THE INVENTION

It is desirable to reduce external vibrations as much as possible in a controllable and predictable manner. For this purpose, an embodiment of the invention provides a module for isolating vibrations from a substrate processing apparatus, such as a lithographic apparatus or an inspection apparatus, the module comprising: a support frame; an intermediate body connected to the support frame by means of at least one spring element such that the intermediate body is a hanging body; and a support body for accommodating the lithographic apparatus, the support body being connected to the intermediate body by at least one pendulum rod such that the support body is a hanging body. The use of an intermediate body enables an effective decoupling of vibrations with different orientations. This allows for an effective isolation from vibrations with the ability to control the frequencies of vibrations that may still couple into the support body for accommodating the lithographic apparatus. Additionally, the use of a hanging intermediate body generally improves the vibration isolation module's stability because the center of mass is lowered as compared to an embodiment in which an intermediate body is put on top of a support frame.

In some embodiments, the position at which the at least one spring element is connected to the intermediate body is adjustable. By adjustment of the connection position in a controllable fashion, the eigenfrequency of the spring element in its operational direction may be tuned. The connection position of the at least one spring element does not necessarily coincide with a projection of a main axis of the at least one pendulum rod. The connection position may be offset to such projection.

In some embodiments, the module includes at least two pendulum rods, and the positions at which the pendulum rods are connected to the intermediate body are adjustable. By adjusting these connection positions the eigenfrequency of rods in their operational direction may be tuned.

In some embodiments, the at least one spring element is a leaf spring. A leaf spring has well-defined vibrational properties. The leaf spring may comprise at least two substantially parallel elongated plates. The thickness and length of these plates largely determine the eigenfrequency of the leaf spring. The leaf spring may comprise a damping element. In case multiple parallel plates are used, the damping element may be provided between the plates. The size and shape of the damping element has an influence on the damping properties of the leaf spring.

In some embodiments, not necessarily comprising a leaf spring, a damping element for damping vibrations is provided between the intermediate body and the support frame. The damping elements allows for damping vibrations that are coupled into the intermediate body.

In some embodiments, the one or more pendulum rods are provided with at least one damping element. This damping element allows for damping vibrations that are coupled into the support body. The damping element may take the form of a ring. The damping element may be movable along the long axis of the rod. Such movement may allow for tuning the damping properties of the module.

Abovementioned damping elements may be made of a viscoelastic material, preferably fluoropolymer elastomer, such as Viton®. Preferably, the damping element is made of a material with low outgassing properties in a vacuum environment.

In some embodiments, the at least one pendulum rod is provided with a flexure point at a predetermined location. The use of a flexure points at a predetermined location improves the predictability of the swinging motion of the at least one pendulum rod, which simplifies the tuning of the eigenfrequencies of the module. Preferably, the rod is provided with two flexure points, the rod being connected to the intermediate body at a position above the upper flexure point, and being connected to the support body at a position below the lower flexure point. Such constructions enable a swinging motion of the rod with the intermediate body and the support body moving in a horizontal plane.

In some embodiments, the support body is provided with a damping element. The use of a damping element in the support body allows for damping vibrations coupled in via the at least one pendulum rod.

Embodiments of the invention further relate to a substrate processing apparatus, such as a lithography system or an inspection system, the substrate processing apparatus comprising: a module as defined above, wherein the support body is arranged for carrying a lithographic apparatus or an inspection apparatus; a moveable target support structure for supporting a substrate to be exposed by the lithographic apparatus or inspection apparatus; and a control system for moving the module and the target support structure relative to each other. The lithographic apparatus may be a multi-beamlet charged particle lithographic apparatus. Such multi-beamlet charged particle lithographic apparatus may comprise: a beam generator for generating a plurality of charged particle beamlets; a beamlet blanker array for patterning the plurality of beamlets in accordance with a pattern; and a projection system for projecting the patterned beamlets onto a target surface of a substrate provided on the target support structure.

BRIEF DESCRIPTION OF THE DRAWINGS

Embodiments of the invention will now be described, by way of example only, with reference to the accompanying schematic drawings in which:

FIG. 10 is a cross-sectional top view of a cavity shown in FIG. 9a; and

DESCRIPTION OF ILLUSTRATIVE EMBODIMENTS

The following is a description of various embodiments of the invention, given by way of example only and with reference to the figures. The figures are not drawn to scale and are merely intended for illustrative purposes. The invention is described in relation to a charged particle lithography system, although it may also be applied for an optical lithography system, an inspection system, and the like.

Figure 1:
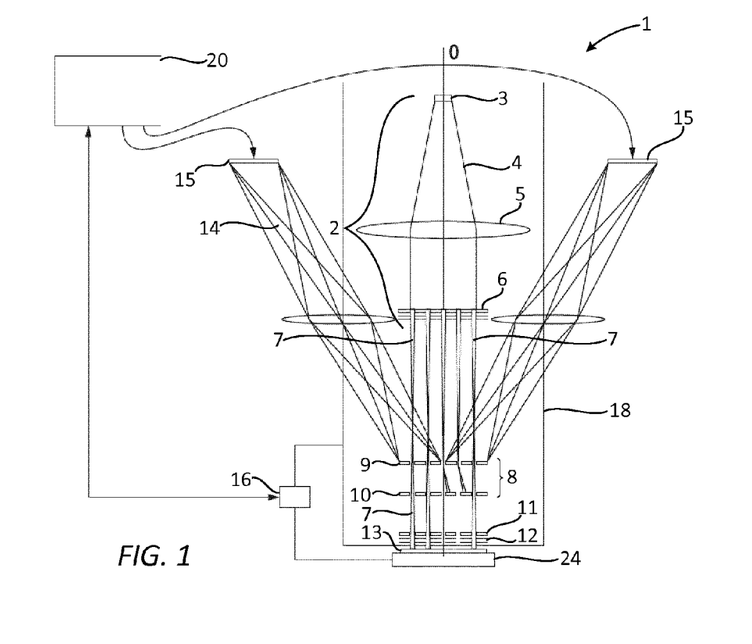
FIG. 1 schematically shows a charged particle multi-beamlet lithography system.

FIG. 1 shows a simplified schematic drawing of an embodiment of a charged particle multi-beamlet lithography system 1. The lithography system 1 suitably comprises a beamlet generator generating a plurality of beamlets, a beamlet modulator patterning the beamlets to form modulated beamlets, and a beamlet projector for projecting the modulated beamlets onto a surface of a target. The components of a lithography or inspection system for generating and projecting the beamlets (whether they are charged particle beams, optical beams, or other types of beams, are typically arranged in a column and are usually referred to as the electron-optical column or optical column, but will be referred to herein as simply the "column".

The beamlet generator typically comprises a source and at least one beam splitter. The source in FIG. 1 is a charged particle source 3 arranged to produce a substantially homogeneous, expanding charged particle beam 4. Hereafter, the operation of the lithography system will be discussed with reference to an electron source 3 arranged for generating an electron beam 4.

In FIG. 1 the electron beam 4 from the electron source 3 passes a collimator lens 5 for collimating the electron beam 4. The collimator lens 5 may be any type of collimating optical system. Subsequently, the electron beam 4 impinges on a beam splitter, in the embodiment of FIG. 1 an aperture array 6. The aperture array 6 preferably comprises a plate having through-holes. The aperture array 6 is arranged to block part of the beam 4. Additionally, the array 6 allows a plurality of beamlets 7 to pass through so as to produce a plurality of parallel electron beamlets 7.

The lithography system 1 of FIG. 1 generates a large number of beamlets 7, preferably about 10,000 to 1,000,000 beamlets, although it is of course possible that more or less beamlets are generated. A second aperture array may be added in the system, so as to create subbeams from the electron beam 4 and to create electron beamlets 7 from the sub-beam. This allows for manipulation of the subbeams further downstream, which turns out beneficial for the system operation, particularly when the number of beamlets in the system is 5,000 or more.

The beamlet modulator, denoted in FIG. 1 as modulation system 8, typically comprises a beamlet blanker array 9 comprising an arrangement of a plurality of blankers, and a beamlet stop array 10. The blankers are capable of deflecting one or more of the electron beamlets 7. In embodiments of the invention, the blankers are more specifically electrostatic deflectors provided with a first electrode, a second electrode and an aperture. The electrodes are then located on opposing sides of the aperture for generating an electric field across the aperture. Generally, the second electrode is a ground electrode, i.e. an electrode connected to ground potential.

To focus the electron beamlets 7 within the plane of the blanker array 9 the lithography system may further comprise a condenser lens array (not shown).

In the embodiment of FIG. 1, the beamlet stop array 10 comprises an array of apertures for allowing beamlets to pass through. The beamlet stop array 10, in its basic form, comprises a substrate provided with through-holes, typically round holes although other shapes may also be used.

The beamlet blanker array 9 and the beamlet stop array 10 operate together to block or let pass the beamlets 7. In some embodiments, the apertures of the beamlet stop array 10 are aligned with the apertures of the electrostatic deflectors in the beamlet blanker array 9. If beamlet blanker array 9 deflects a beamlet, it will not pass through the corresponding aperture in the beamlet stop array 10. Instead the beamlet will be blocked by the substrate of beamlet block array 10. If beamlet blanker array 9 does not deflect a beamlet, the beamlet will pass through the corresponding aperture in the beamlet stop array 10. In some alternative embodiments, cooperation between the beamlet blanker array 9 and the beamlet stop array 10 is such that deflection of a beamlet by a deflector in the blanker array 9 results in passage of the beamlet through the corresponding aperture in the beamlet stop array 10, while non-deflection results in blockage by the substrate of the beamlet stop array 10.

The modulation system 8 is arranged to add a pattern to the beamlets 7 on the basis of input provided by a control unit 20. The control unit 20 may be located remote from the rest of the system, for instance outside the inner part of a clean room. The control system may further be connected to an actuator system 16. The actuator system is arranged for executing a relative movement of the electron-optical column represented by the dashed line in FIG. 1 and a target positioning system 24.

Modulated light beams 14 holding pattern data are transmitted to the beamlet blanker array 9 using optical fibers. More particularly, the modulated light beams 14 from optical fiber ends are projected on corresponding light sensitive elements located on the beamlet blanker array 9. The light sensitive elements may be arranged to convert the light signal into a different type of signal, for example an electric signal. A modulated light beam 14 carries a portion of the pattern data for controlling one or more blankers that are coupled to a corresponding light sensitive element. In some embodiments, the light beams may, at least partially, be transferred towards the light sensitive elements by means of an optical waveguide.

The modulated beamlets coming out of the beamlet modulator are projected as a spot onto a target surface of a target 13 by the beamlet projector. The beamlet projector typically comprises a scanning deflector for scanning the modulated beamlets over the target surface and a projection lens system for focusing the modulated beamlets onto the target surface. These compounds may be present within a single end module.

Such end module is preferably constructed as an insertable, replaceable unit. The end module may thus comprise a deflector array 11, and a projection lens arrangement 12. The insertable, replaceable unit may also include the beamlet stop array 10 as discussed above with reference to the beamlet modulator. After leaving the end module, the beamlets 7 impinge on a target surface positioned at a target plane. For lithography applications, the target 13 usually comprises a wafer provided with a charged-particle sensitive layer or resist layer.

The deflector array 11 may take the form of a scanning deflector array arranged to deflect each beamlet 7 that passed the beamlet stop array 10. The deflector array 11 may comprise a plurality of electrostatic deflectors enabling the application of relatively small driving voltages. Although the deflector array 11 is drawn upstream of the projection lens arrangement 12, the deflector array 11 may also be positioned between the projection lens arrangement 12 and the target surface.

The projection lens arrangement 12 is arranged to focus the beamlets 7, before or after deflection by the deflector array 11. Preferably, the focusing results a geometric spot size of about 10 to 30 nanometers in diameter. In such preferred embodiment, the projection lens arrangement 12 is preferably arranged to provide a demagnification of about 100 to 500 times, most preferably as large as possible, e.g. in the range 300 to 500 times. In this preferred embodiment, the projection lens arrangement 12 may be advantageously located close to the target surface.

Commonly, the target surface comprises a resist film on top of a substrate. Portions of the resist film will be chemically modified by application of the beamlets of charged particles, i.e. electrons. As a result thereof, the irradiated portion of the film will be more or less soluble in a developer, resulting in a resist pattern on a wafer. The resist pattern on the wafer can subsequently be transferred to an underlying layer, i.e. by implementation, etching and/or deposition steps as known in the art of semiconductor manufacturing.

In the embodiment of FIG. 1, the column may comprise the components illustrated within the dotted line 18 in the drawing, although the column may include other components and other arrangements are possible.

Figure 2:
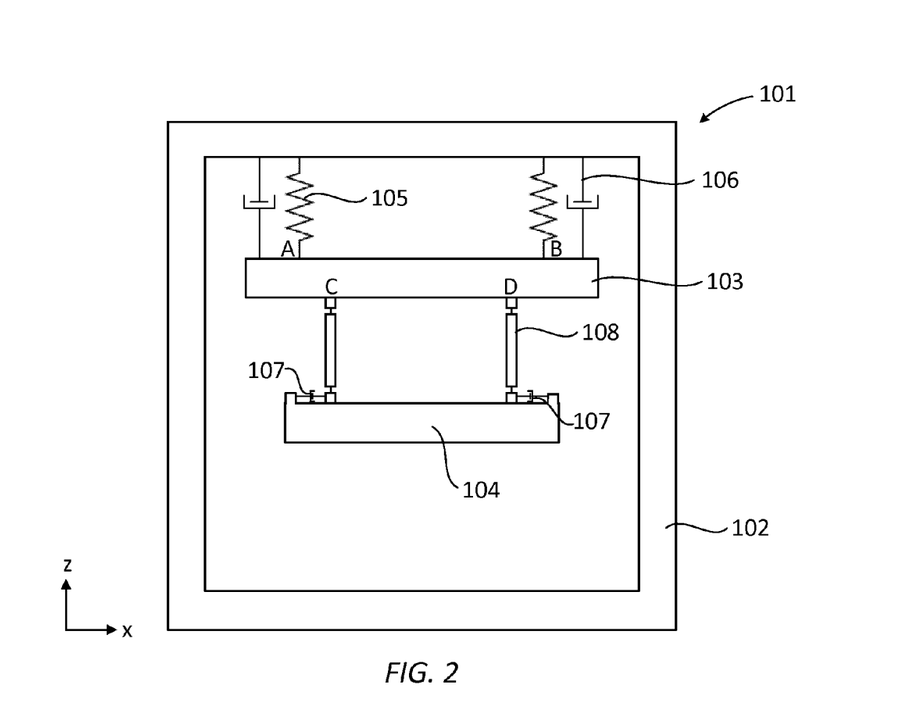
FIG. 2 schematically shows a vibration isolation module according to an embodiment of the invention.

FIG. 2 schematically shows a vibration isolation module 101 according to an embodiment of the invention. The vertical direction in FIG. 2 corresponds to the z-direction, whereas the horizontal direction shown in FIG. 2 corresponds to the x-direction. The y-direction is perpendicular to both the x-direction and the z-direction and extends into and out of the paper.

The module 101 comprises a support frame 102, an intermediate body 103 and a body 104 arranged for accommodating, or supporting, the column of a substrate processing apparatus such as a lithography or inspection apparatus, for example the electron optical column of a multi-beamlet charged particle lithography system as schematically depicted in FIG. 1. The latter body 104 will hereafter be referred to as support body 104.

The support frame 102 is connected to the intermediate body 103 by means of spring elements 105. The spring elements may be provided with damping elements 106 to enable vibrational damping, particularly in the z-direction. For clarity the spring elements 105 and damping elements 106 are depicted separately. However, in actual embodiments of the invention, the damping elements 106 may be integrated with the spring elements 105. An example of such an integrated structure will be discussed with reference to FIGS. 4a-4c.

As schematically depicted in FIG. 2, the spring elements 105 connect the intermediate body 103 to the support frame 102 in such a way that the intermediate body 103 is a hanging body. The use of a hanging intermediate body 103 may improve the vibration isolation module's stability because the center of mass is lowered as compared to an embodiment in which an intermediate body is put on top of a support frame 102.

The support body 104 is also connected to the intermediate body 103. The connection between the body 104 and the body 103 is by means of at least one rod-like structure, further referred to as pendulum rod 108. The body 104 may thus be qualified as a hanging body as well. The intermediate body 103 may be referred to as the first hanging body and the support body 104 may be referred to as the second hanging body.

The at least one pendulum rod 108 should be sufficiently strong to carry the body 104, which may have a mass of several hundreds of kilograms, and capable of permitting the body 104 to swing. The intermediate body 103 and/or the support body 104 may be provided with damping elements 107 to dampen vibrations in the horizontal plane and preferably also to dampen vibrations in a rotational direction about the z-direction axis, i.e. Rz.

The support frame 102 is preferably made of a material with sufficient stiffness to provide support without deformation, for example a suitable metal such as aluminum. Furthermore, in particular in applications using charged particle beamlets, the material is non-magnetic.

The support frame 102 comprises a base plate 110, a top section 112, and upstanding structures 114 connecting the top section 112 with the base plate 110. The frame 102 may take any suitable shape, for example box-shaped, substantially cubically shaped or a shape formed by a triangular base plate 110 and top section 112 connected by the upstanding structures 114.

The spring elements 105 are arranged for decreasing the influence of external vibrations on the position of the support body 104. By suitable selection of parameters such as shape, size and material of the spring elements 105, the incoupling of particular frequency components in external vibrations may be minimized. In particular, the spring elements 105 enable a decoupling of vibrations in the z-direction as well as vibrations in a rotational direction about the x-direction axis and the y-direction axis, i.e. Rx and Ry respectively. An exemplary spring element that may be used in embodiments of the invention will be discussed with reference to FIGS. 4a-4c.

The intermediate body 103 may take the form of a plate or a number of plates connected to each other. The intermediate body 103 may also comprise one or more cut-outs to reduce weight. The material of the intermediate body is preferably a non-magnetic material, preferably a non-magnetic metal.

The intermediate body 103 enables a decoupling of vibrations in the z-direction and vibrations in the x, y and Rz-directions. By suitable positioning of the connection positions of the intermediate body 103 with the spring elements 105, for example positions A and B in FIG. 2, the eigenfrequencies in the z-direction that may couple into the support body 104 may be set. Similarly, by suitable positioning of the one or more connection positions of the intermediate body 103 with the one or more pendulum rods 108, such as positions C and D in FIG. 2, the eigenfrequencies in Rz-direction that can couple into the support body 104 may be set. The eigenfrequencies in the x and y-directions may be set by choosing the length of the one or more pendulum rods 108.

Furthermore, the frequencies that are allowed to couple into the support body 104 may be set by selecting a suitable length of the one or more pendulum rods 108. The rods 108 form a low-pass filter which cut-off frequency is dependent on the length of the one or more rods 108. Preferably, the one or more rods 108 have a length that exceeds the height of the column the support body 104 is carrying. To improve stiffness without unduly increasing weight, the one or more rods 108 are preferably hollow.

The adjustability of the connection positions of the intermediate body 103 with the spring elements 105 and the one or more pendulum rods 108 opens the possibility to position the intermediate body 103, the spring elements 105, and the one or more rods 108 in such a way with respect to each other that the connection positions of the spring elements 105 do not coincide with a projection of a main axis along the length of the one or more pendulum rods 108. Consequently, the use of an intermediate body 103 provides design freedom regarding the setting of eigenfrequencies of the system.

In lithographic applications, preferably, the eigenfrequencies in the z-direction are chosen to be below 15 Hz, preferably below 5 Hz, whereas the eigenfrequencies in the x, y and Rz-directions are chosen to be below 3 Hz, preferably below 1 Hz. Specific choices of eigenfrequencies may depend on the bandwidth of the system responsible for compensating vibrations, for example control unit 20 in FIG. 1 using actuator system 16.

Furthermore, in lithographic application, in particular in case charged particle beamlets are use for exposing of a target, the vibration isolation requirements are generally more strict for x-, y- and Rz-directions than for z-, Rx- and Ry-directions. Vibrations in the x, y and Rz-direction may have a significant influence on beamlet positioning, which may lead to exposure errors. On the other hand, vibrations in the z, Rx and Ry directions have an influence on the beamlet spot size on the target. However, charged particle beamlets in many lithographic systems have a relatively large depth of focus. Consequently, a small deviation in a direction away from the focal plane is of less significance for the quality and reliability of the exposed pattern.

Figure 3:
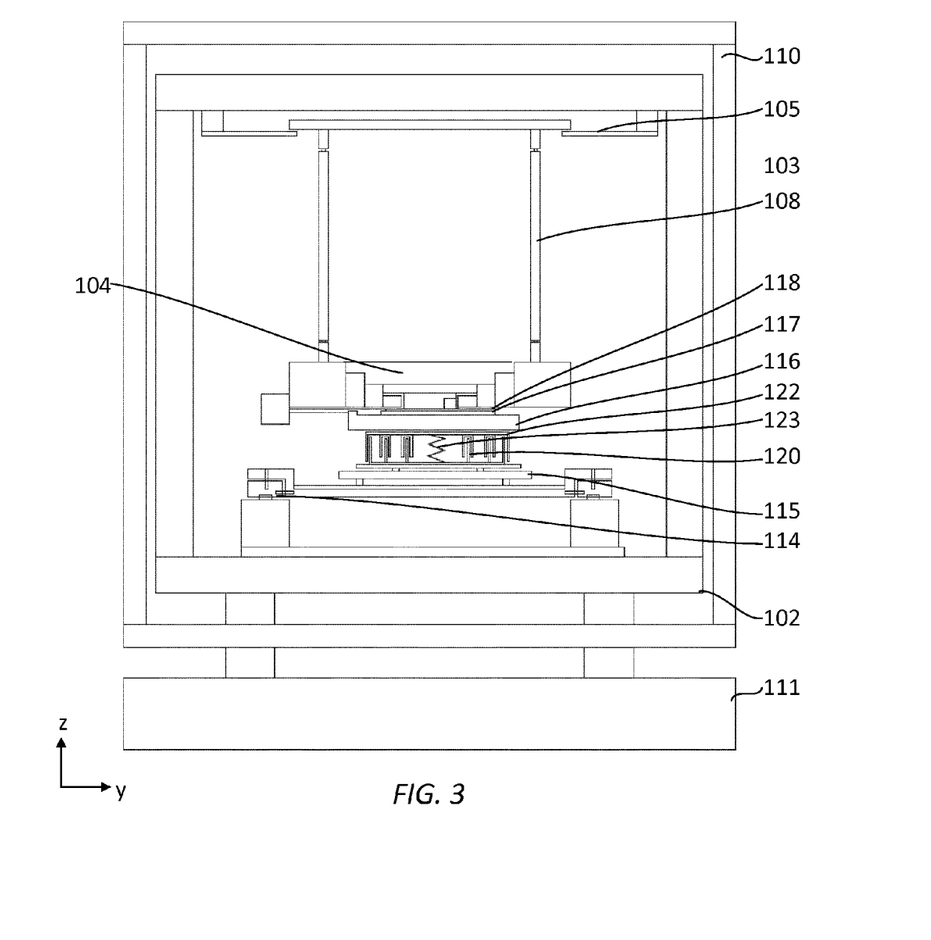
FIG. 3 schematically shows an embodiment of a vacuum chamber comprising a vibration isolation module according to an embodiment of the invention.

FIG. 3 schematically shows an embodiment of a vacuum chamber 110 comprising a vibration isolation module according to an embodiment of the invention. In this embodiment, the vacuum chamber 110 is positioned on top of a base frame 111. Within the vacuum chamber 110 the support frame 102 is positioned on top of a bottom wall of the vacuum chamber 110. The support frame 102 comprises a bottom structure on top of which a stage is mounted. The stage comprises an X-stage 114, in FIG. 3 arranged for movement in the x-direction, i.e. the direction into and out of the paper, and a Y-stage 115 arranged for movement in the y-direction, i.e. the horizontal direction from left to right in the paper plane. The Y-stage 115 is arranged for supporting a chuck 116, for example the target positioning system 24 in FIG. 1. The chuck 116 is arranged for supporting a substrate support structure 117 on top of which a substrate 118 may be placed, for example a wafer.

In the shown embodiment, the Y-stage 115 comprises positioners 120 for moving a member 122 in the Y-direction. The positioners typically take the form of electromotors, preferably linear motors, preferably comprising Lorentz-type actuators. In a Lorentz-type actuator the applied force is linearly proportional to the current and the magnetic field. Furthermore, the Y-stage 115 is provided with a gravity compensation spring 123 for decoupling vibrations in the support frame 102 from the substrate support structure 117 and the substrate 118 provided thereon.

An intermediate body 103 is connected to the substrate frame 102 via spring elements 105. In this embodiment, the intermediate body 103 rests on top of the spring elements 105 which may take the form of leaf springs. Support body 104 is connected to the intermediate body via pendulum rods 108. The pendulum rods 108 comprise two flexure points. Such flexure points may be created by locally reducing the cross-sectional area of the rod 108. The presence of the two flexure points causes the swinging motion of the support body 104 to occur in the horizontal plane, i.e. the xy-plane. The term "flexure point" used herein is meant to refer to a point about which a part of the rod 108 at one side of the flexure point is able to pivot and/or swivel with respect to a part of the rod 108 at the other side of the flexure point.

Similar to the embodiment in FIG. 2, the eigenfrequencies of the spring elements 105 in their operational direction, in particular in the z-direction, is tunable by adjusting the position at which they connect to the intermediate body 103. These connection positions of the spring elements 105 may not coincide with a projection of a main axis of the one or more pendulum rods. Consequently, the eigenfrequencies in Rz-direction that can couple into the support body 104 may be set with limited influence of the spring elements 105. This again shows the design freedom regarding the setting of eigenfrequencies that is provided by using an intermediate body 103.

Figure 4A:
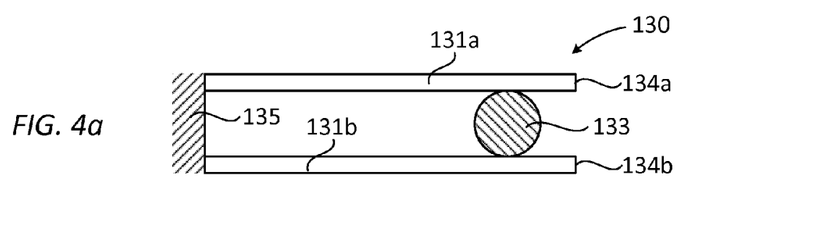
FIGS. 4a, 4b schematically depict an embodiment of a leaf spring that may be used in embodiments of the invention in different positions.
Figure 4B:
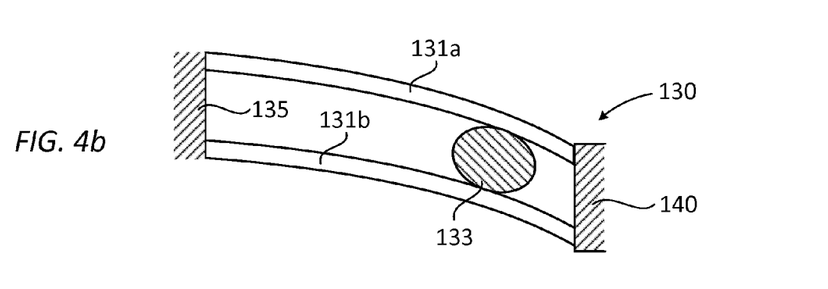

FIGS. 4a, 4b schematically depict the concept of using a leaf spring 130 in embodiments of the invention. The leaf spring 130 is connected to a support body 135 at the left side, for example the support frame 102. The leaf spring 130 comprises two substantially parallel elongated plates 131a, 131b with a damping element 133 placed in the intermediate space between the two plates 131a, 131b and in contact with both plates 131a, 131b. The shape and dimensions of the damping element 133 may be adjusted to obtain a suitable performance. In most cases, merely a damping of less than 5% is required. Therefore, in most cases, volume constraints and availability of material are the design drivers.

The damping element 133 may be made of a viscoelastic material. The use of a viscoelastic material enables the possibility to adjust the damping performance by changing size and shape in a relatively easy way. Furthermore, the use of a viscoelastic material makes it possible to position the damping element 133 between the plates 131a, 131b without the use of an adhesive. By allowing the damping element 133 to have a slightly larger thickness than the nominal distance between the plates 131a, 131b the damping element may be fixed between the plates by compressing the damping element 133 during placement between the plates 131a, 131b. The viscoelastic properties of the damping element 133 than suffice to keep the damping element 133 at its position.

Preferably, the damping element 133 is made of a damping material with limited outgassing under vacuum conditions, such as a fluoropolymer elastomer, for example a VITON® fluoroelastomer.

In FIG. 4a the plates 131a, 131b have free ends 134a, 134b, i.e. the plates are not connected to a further body. Consequently, in case the plates 131a, 131b are sufficiently stiff, the plates extend in a substantially horizontal direction. The damping element 133 takes a form corresponding to a "rest shape". In FIG. 4b the plates 131a, 131b are connected to a further body 140, for example the intermediate body 103. As a result of the weight the plates 131a, 131b bend and the damping element 133 is deformed.

It will be understood that external vibrations, i.e. vibrations that work on the support body 135 and couple through the further body 140 cause the plates 131a, 131b to move slightly up and down about the position shown in FIG. 4b. The damping element 133 thus deforms slightly, which absorbs energy and, consequently, damps the vibrations.

Preferably, three leaf springs 130 are oriented with respect to each other in such a way that vibration control, as well as damping in case damping elements 133 are present, cancel each other out in all directions except the z-direction. Furthermore, the three springs 130 provide a statically determined structure.

Figure 5A:
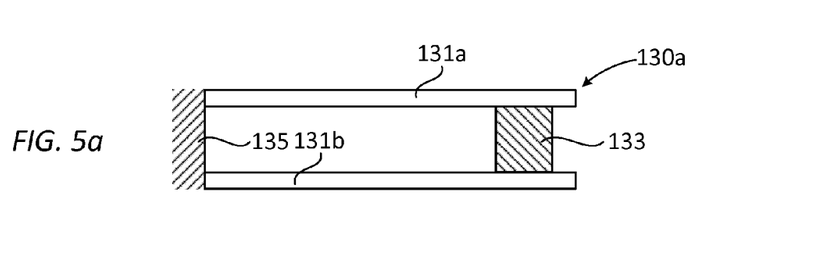
FIGS. 5a-5c schematically show different embodiments of leaf springs that may be used in embodiments of the invention.
Figure 5B:
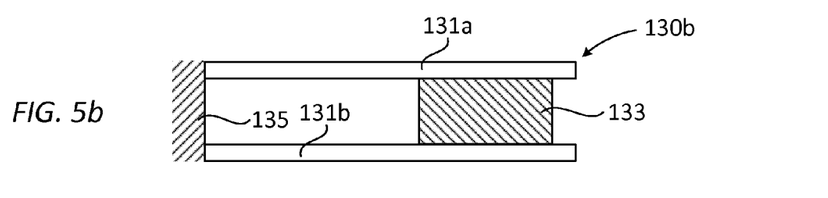
Figure 5C:
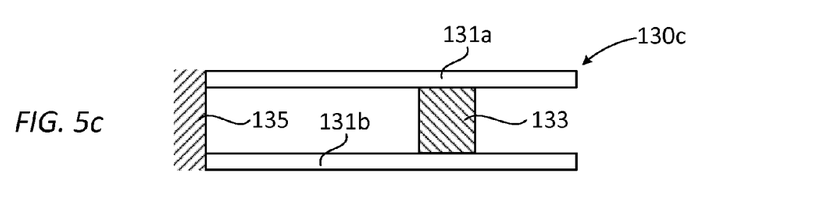

FIGS. 5a-5c schematically show different leaf springs 130a, 130b, 130c that may be used in embodiments of the invention. Again the leaf springs 130a, 130b, 130c each comprise two substantially parallel elongated plates 131a, 131b with a damping element 133 placed in the intermediate space between the two plates 131a, 131b and in contact with both plates 131a, 131b. The damping characteristics of each of the different leaf springs 130a, 130b, 130c is different.

The leaf spring 130a of FIG. 5a has a damping element 133 positioned near the end arranged for connection to the further body (not shown). The spring 130b of FIG. 5b has a damping element 133 that extends over a larger portion of the plates 131a, 131b compared to the leaf spring 130a. The spring element 130c of FIG. 5c has a damping element 133 similar in size to the damping element 133 of the spring element 130a, however its location is different. The damping element 133 of the spring element 130c is located at a position closer to the support body 135.

As a result, leaf spring 130b has a greater damping capability than leaf spring 130a, whereas leaf spring 130c has a smaller damping capability than leaf spring 130a. The damping element 133 of leaf spring 130b thus damps the most, whereas the damping element 133 of leaf spring 130c damps the least. By adapting the size and/or position of the damping element 133 a suitable damping can be achieved while remaining within preset requirements regarding the allowable eigenfrequency of the leaf springs 130.

Figure 6A:
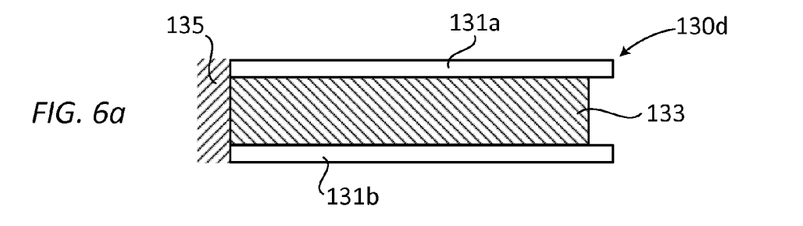
FIGS. 6a, 6b schematically show two other embodiments of leaf springs that may be used in embodiments of the invention.
Figure 6B:
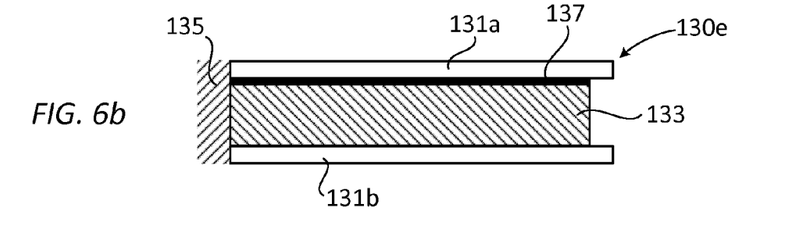

As will be directly and unambiguously derivable from the description above the damping element 133 may fill the entire volume between the two plates 131a, 131b, or at least a majority thereof. Examples of such leaf springs are schematically depicted in FIGS. 6a, 6b as leaf springs 130d, 130e respectively.

The damping element 133 of leaf spring 150d occupies the majority of the space between upper plate 131a and lower plate 131b. The use of such damping element 133 has the advantage that it provides more damping. Furthermore, the design is easy to manufacture.

Preferably, at least one side of the damping element 133 facing the plates 131a, 131b is covered with an anti-slip layer 137. Leaf spring 130e is an example of a leaf spring that comprises an anti-slip layer 137. The anti-slip layer 137 prevents relative movement between the damping element 133 and the plate 131a, 131b that the anti-slip layer 137 is in contact with. Without the presence of such anti-slip layer, tension may built up in the damping element 133 which may result in a reduction of damping performance, and eventually in abovementioned relative movement upon release of such built-up tension. The leaf spring 130e therefore may have a more reliable and better performance over time. Additionally, the use of an anti-slip layer 137 in leaf spring 130e may enable the leaf spring 130e to handle a greater mass. Alternatively, the dimensions of the leaf spring 130e may be reduced as compared to a leaf spring without anti-slip layer 137. Space is valuable in lithography applications and a reduction of size of the leaf spring may enable the use of a more compact design of the vibration isolation module 101. The anti-slip layer 137 may be provided on both sides, i.e. a first side facing plate 131a and a second opposing side facing plate 131b. However, in most embodiments, providing the anti-slip layer 137 at one side of the damping element 133 is sufficient.

Preferably, the material of the anti-slip layer 137 has a static friction coefficient that is substantially the same as a dynamic friction coefficient of the anti-slip layer material. A suitable material having such similar static and dynamic friction coefficient is polytetrafluoroethylene (PTFE), also known as Teflon®. In addition, PTFE has the advantage that it is a material that is vacuum compatible with limited outgassing.

Figure 7A:
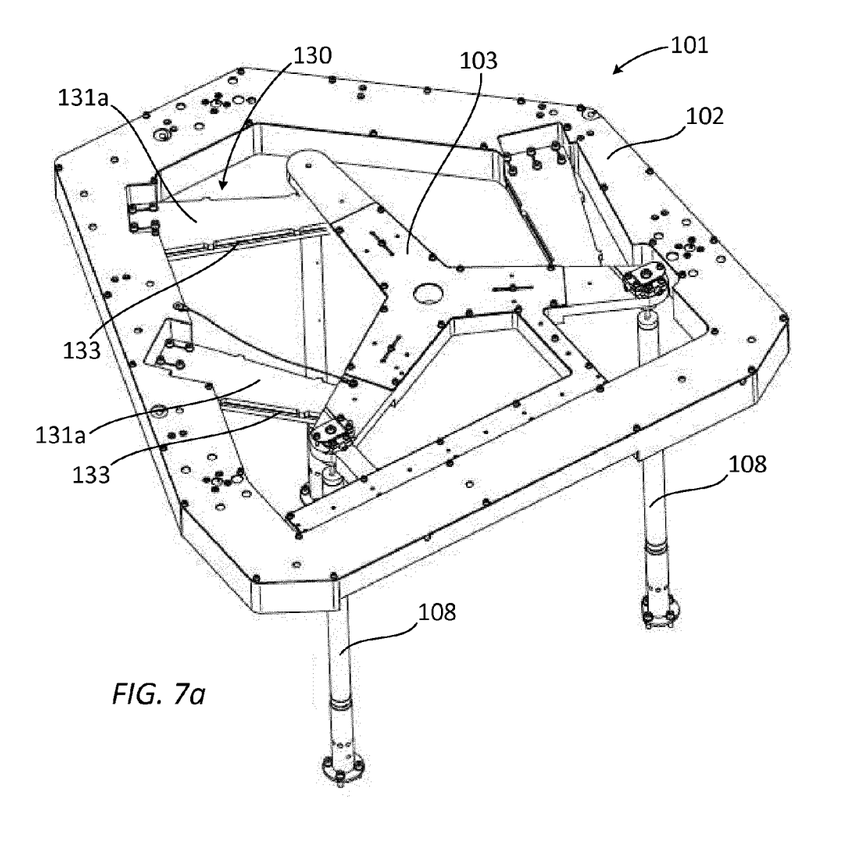
FIGS. 7a, 7b schematically show different view of a portion of a further embodiment of the module of FIG. 2.
Figure 7B:
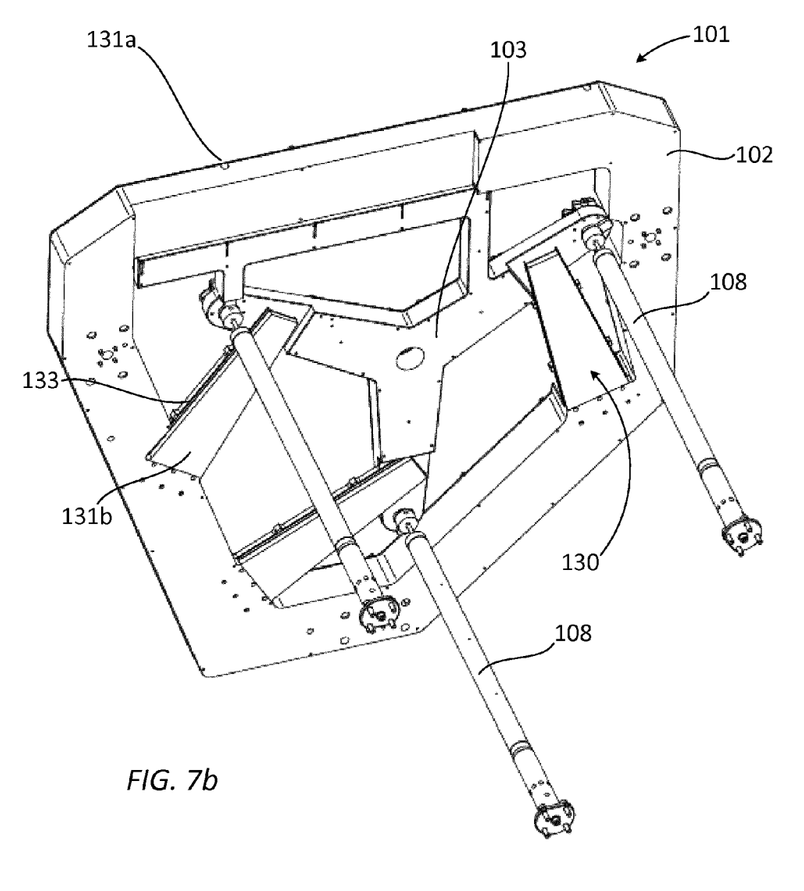

FIGS. 7a, 7b schematically show different views of a portion of a further embodiment of the module 101 of FIG. 2. In this embodiment, the module 101 comprises a support frame 102 connected to the intermediate body 103 by means of three leaf springs 130. The use of three leaf springs 130 cancels out any movement in Rz, i.e. a rotational direction about the z-axis. Additionally, any movement in x and y is limited as well. The connection of the leaf springs 130 with the intermediate body 103 is such that movement in z, and to some extent in Rx and Ry, is possible.

Furthermore, the support body, which is not depicted in FIGS. 7a, 7b, is connected to the intermediate body 103 by means of three pendulum rods 108. The use of three leaf springs 130 and three pendulum rods 108 provides a statically determined structure.

Each leaf spring 130 comprises an upper plate 131a, a lower plate 131b and a damping element 133 that is positioned, i.e. preferably clamped, between the two plates 131a, 131b. It will be readily understood that the leaf springs may take any suitable form, including the leaf spring embodiments 130a-130e depicted in FIGS. 5a-c and 6a-b respectively.

Preferably, the support frame 102 and the plates of the leaf springs 130 form an integrated structure. For example, the support frame 102 and plates of the leaf springs 130 may be formed by using a suitable milling process. The damping elements 133 may then be placed between the plates of the leaf springs 130 after formation of the integrated structure.

Preferably, the three leaf springs 130 are oriented with respect to each other in such a way that vibration control, as well as damping in case damping elements 133 are present, cancel each other out in all directions except the z-direction. Preferably, adjacent leaf springs 130 are oriented at an angle of 120° with each other. Most preferably, their orientation is such that the projection of the long axes of all leaf springs 130 meet in the same point. However, as depicted in FIGS. 7a, 7b, the leaf springs 130 may be oriented in a different way due to design constraints such as the amount of space that is available.

The intermediate body 103 may have a symmetric shape. A symmetric shape helps to divide the mass load equally over the leaf springs 130. Furthermore, as depicted in FIGS. 7a, 7b, as compared to a mere plate design, the intermediate body 103 may take the form of a multi-arm body, i.e. in FIGS. 7a, 7b having three arms, to limit the mass the leaf springs 130 have to carry.

Figure 8:
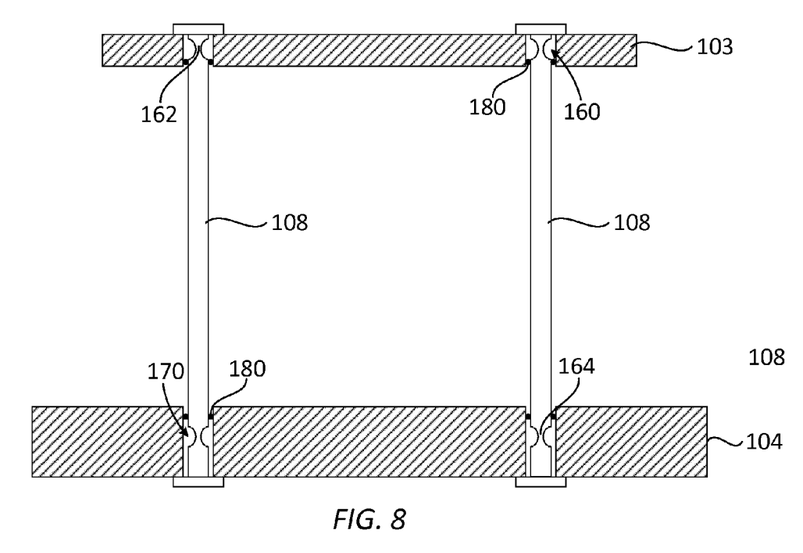
FIG. 8 schematically shows a cross-sectional view of another portion of a further embodiment of the module of FIG. 2.

FIG. 8 schematically shows a portion of a further embodiment of the module of FIG. 2. Also in this embodiment, at least two rods 108 are connecting the intermediate body 103 with the support body 104. The rods 108 are placed in two corresponding cavities 160 in the intermediate body 103 at the upper side of the rods 108 and in two corresponding cavities 170 in the support body 104 at the lower side of the rods 108.

Within the cavities 160 the rods 108 are provided with an upper flexure point 162. Similarly, within the cavities 170 the rods 108 are provided with a lower flexure point 164. At a flexure point 162, 164, the cross-sectional area of the rod is reduced, and as a result, the rod will bend at these flexure points. The flexure points could also be implemented as a section of the rods being composed of a different material which bends more easily than the main section of the rods, or a section of the rods being composed of the same material but treated so that it bends more easily than the main section of the rods. By designing the flexure points at a predetermined location, the swinging properties, including the eigenfrequencies of the rod in certain directions, can be preset.

The flexure points 162, 164 allow the rods 108 to execute a pendulum movement without substantially rotating the bodies 103, 104. Instead, a pendulum motion of the rods 108 results in a oscillating movement of the bodies 103, 104 in a direction substantially perpendicular to the main axis of the rods 108 in rest. To allow both bodies 103, 104 to move in a substantially horizontal direction, the rods 108 are connected to the intermediate body 103 at a position above the respective upper flexure points 162 and to the support body 104 at a position below the respective lower flexure points 164. Although the rods 108 in FIG. 8 extend through the entire bodies 103, 104 in FIG. 8 it will be understood that different constructions for connecting the rods 108 to the bodies 103, 104 are possible as well. For example, the cavities 160 and/or 170 may be in the form of wells or indents extending through only a portion of the intermediate body 103 and support body 104 respectively, or the cavities may be omitted entirely as in the embodiment in FIG. 3. Connecting the rod ends 108 to the bodies 103, 104 may be done using constructions well-known in the art, for example by using bolts and nuts or by using welding techniques.

The pendulum rods 108 may be provided with damping elements 180. The damping elements 180 enable damping of the pendulum movement of the rods 108, so that oscillations at frequencies close to the resonance frequencies of the rods 108 are sufficiently damped. As shown in FIG. 8 the damping elements 180 may take the form of hollow structures such as rings, although alternative structures may be used such as sleeves or other structures surrounding the flexure points to dampen their movement. Alternatively, or additionally, suitably shaped elastic inserts may be placed in the cavities 160 and/or 170 to provide damping.

Figures 9A, 9B:
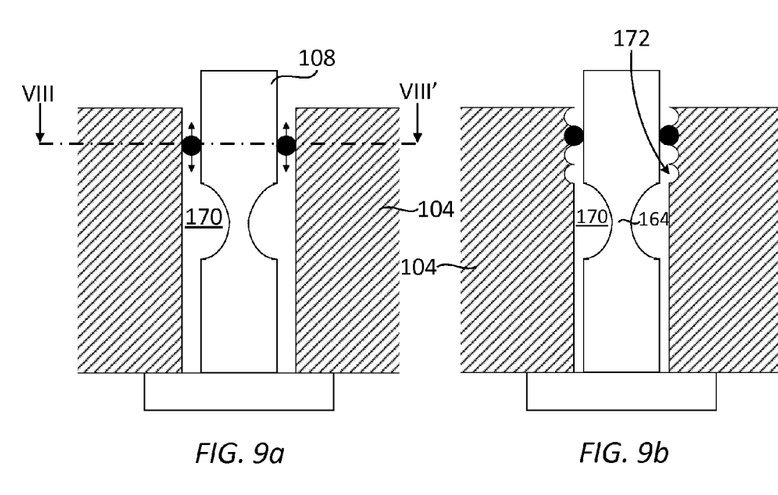
FIGS. 9a, 9b depict two different damping constructions that may be used in embodiments of the invention.

FIGS. 9a, 9b depict two different damping constructions that may be used in embodiments of the invention. In particular, FIGS. 9a, 9b provide a more detailed view on the damping of the rod 108 using a damping element 180 placed around the rod 108 within the cavity 170 of the support body 104. In these embodiments, the rod 108 has a substantially circular cross-section and the damping element 180 may take the form of a ring of viscoelastic material, for example comprising a fluoropolymer elastomer such as Viton®. Alternatively, the damping element 180 may be a spring collar or the like.

In the embodiment of FIG. 9a, the inner ring diameter of the damping element 180 is slightly smaller than the rod diameter, which results in the damping element 180 clamping itself to the rod 108 due to the resilience forces working onto it. The exact damping characteristics of the damping element 180 may be set by moving the element 180 along the length of the rod 108 to a suitable position within the cavity 170, an action schematically denoted in FIG. 9a by the double arrow. The ability to adjust the position of the damping element 180 enables adaptation of the vibration isolation characteristics of the module without the need to manufacture new components.

In the embodiment of FIG. 9b the inner ring diameter of the damping element 180 is equal or greater than the rod diameter. In this embodiment, the inner walls of the cavity 170 are provided with one or more grooves 172. A series of such grooves 172 may form a serrated inner wall surface. The grooves 172 enable placement of the damping element 180 at a predetermined position within the cavity 170 before the rod 180 is placed into the cavity 170. In this way, the vibration isolation characteristics of the module can be varied in a very predictable manner. The use of multiple grooves provides the possibility to change the characteristics when needed.

Figure 10:
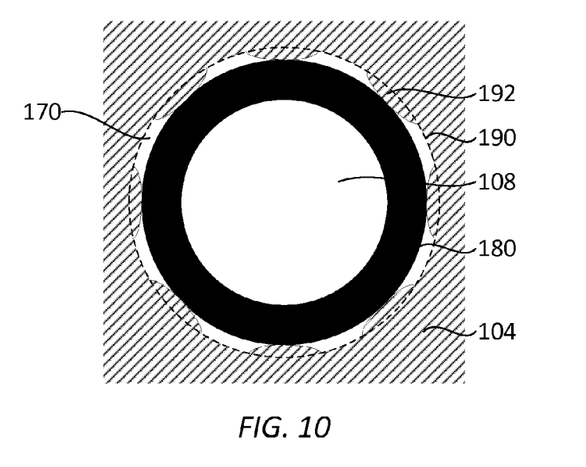

FIG. 10 shows a top view of the cavity 170 of the embodiment of FIG. 9a taken along the line VIII-VIII'. The inner wall of the cavity 170 is denoted by the dashed circular line 190. The inner wall of the cavity 170 has a cross-sectional shape that differs from the cross-sectional shape of the damping element 180 in the same plane. In particular, the outer cross-sectional shape of the damping element 180 is a circular, whereas the cross-sectional shape of the inner wall of the cavity 170 may be described as a circle provided with cutouts created by longitudinal protrusions 192 in a substantially vertical direction. Due to the shape difference the damping element 180 has the ability to clamp the rod 108 while simultaneously having some space in the lateral direction to deform. The ability to deform in such lateral direction causes an increase of the damping element's damping capacity. Of course different ways of creating lateral space may be used. For example, instead of providing a pattern of protrusions, the inner wall 190 may be provided with a pattern of depressions, such as grooves.

Figure 11A:
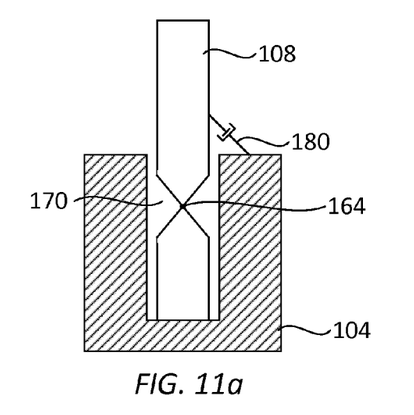
FIGS. 11a-11c schematically show different embodiments of damping elements.
Figure 11B:
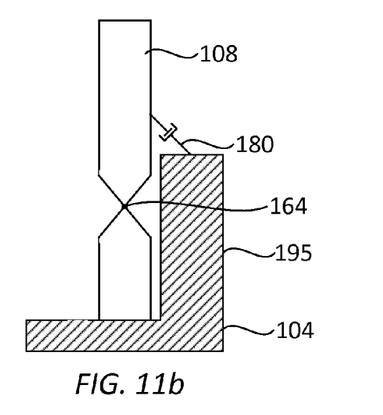
Figure 11C:
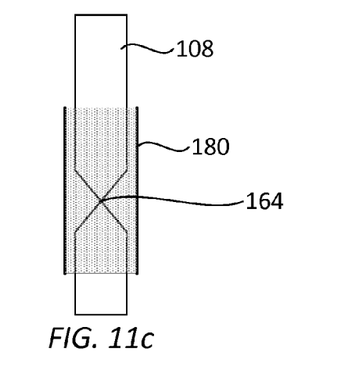

FIGS. 11a-11c schematically show different embodiments of damping elements 180. In FIG. 11a, a damping element 180 is provided between the support body 104 and the rod 108 outside cavity 170. In FIG. 11b, the support body is not provided with a cavity 170. The body 104 is provided with a raised portion 195. A damping element 180 may now be placed between the rod 108 and the raised portion 195. Finally, FIG. 11c schematically shows a damping element 180 that takes the form of a tube segment surrounding the rod 108. It must be understood that many more alternative embodiments of damping elements 180, different from the ones shown in FIGS. 11a-11c, may be used.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. Module for isolating vibrations from a substrate processing apparatus such as a lithographic apparatus or inspection apparatus, the module comprising:
    a support frame;
    an intermediate body connected to the support frame by means of at least one spring element such that the intermediate body is a hanging body; and
    a support body for accommodating the substrate processing apparatus, the support body being connected to the intermediate body by means of at least one pendulum rod such that the support body is a hanging body; and
    wherein the at least one pendulum rod is provided with a flexure point.

2. Module according to claim 1, wherein the at least one pendulum rod is provided with two flexure points, the rod being connected to the intermediate body at a position above the upper flexure point, and being connected to the support body at a position below the lower flexure point.

3. Module according to claim 1, wherein the position at which the at least one spring element is connected to the intermediate body is adjustable.

4. Module according to claim 1, wherein the connection position of the at least one spring element is offset to a projection of a main axis of the at least one pendulum rod.

5. Module according to claim 1, wherein the module includes at least two pendulum rods, and wherein the positions at which the pendulum rods are connected to the intermediate body are adjustable.

6. Module according to claim 1, wherein the at least one spring element is a leaf spring.

7. Module according to claim 6, wherein the leaf spring comprises at least two substantially parallel elongated plates.

8. Module according to claim 7, wherein the plates of the leaf spring and the support frame form an integrated structure.

9. Module according to claim 7, wherein the leaf spring comprises a damping element positioned between the plates, wherein at least one side of the damping element facing the plates is covered with an anti-slip layer.

10. Module according to claim 6, wherein the leaf spring comprises a damping element.

11. Module according to claim 1, further comprising a damping element for damping vibrations between the intermediate body and the support frame.

12. Module according to claim 1, wherein the at least one pendulum rod is provided with a damping element.

13. Module according to claim 12, wherein the damping element takes the form of a ring surrounding the rod.

14. Module according to claim 12, wherein the damping element is moveable along the long axis of the rod.

15. Module according to claim 1, wherein the at least one pendulum rod has a length that exceeds the height of a column of the substrate processing apparatus.

16. Module according to claim 1, wherein the support body is provided with a cavity, the cavity comprising an inner wall comprising a groove for receiving a damping element.

17. Substrate processing system comprising a vibration isolation module according to claim 1, the system further comprising:
- a moveable target support structure for supporting a substrate to be exposed by the lithographic apparatus or inspection apparatus; and
- a control system for moving the module and the target support structure relative to each other.

18. System according to claim 17, wherein the substrate processing system is a lithography system, and wherein the support body accommodates a multi-beamlet charged particle lithographic apparatus.

19. System according to claim 18, wherein the multi-beamlet charged particle lithographic apparatus comprises:
- a beam generator for generating a plurality of charged particle beamlets;
- a beamlet blanker array for patterning the plurality of beamlets in accordance with a pattern; and
- a projection system for projecting the patterned beamlets onto a target surface of a substrate provided on the target support structure.

* * * * *